United States Patent [19]

Summerfelt

[11] Patent Number: 5,393,352
[45] Date of Patent: Feb. 28, 1995

[54] PB/BI-CONTAINING HIGH-DIELECTRIC CONSTANT OXIDES USING A NON-P/BI-CONTAINING PEROVSKITE AS A BUFFER LAYER

[75] Inventor: Scott R. Summerfelt, Dallas, Tex.

[73] Assignee: Texas Instruments Incorporated, DAllas, Tex.

[21] Appl. No.: 127,222

[22] Filed: Sep. 27, 1993

Related U.S. Application Data

[63] Continuation of Ser. No. 876,930, May 1, 1992, abandoned.

[51] Int. Cl.$^6$ .......................................... H01L 29/12
[52] U.S. Cl. ................................. 148/33.3; 437/235; 437/919; 148/DIG. 14; 148/DIG. 118
[58] Field of Search ............................. 437/235, 919; 148/DIG. 118, DIG. 14, 33.3

[56] References Cited

U.S. PATENT DOCUMENTS

| | | | |
|---|---|---|---|
| 4,994,435 | 2/1991 | Shiga et al. | 437/62 |
| 5,173,835 | 12/1992 | Cornett et al. | 257/310 |
| 5,179,070 | 1/1993 | Harada et al. | 257/33 |

FOREIGN PATENT DOCUMENTS

WO 91/13465  9/1991  WIPO .

OTHER PUBLICATIONS

Horwitz, et al., "In Situ Deposition of Epitaxial PbZr$_x$Ti$_{(1-x)}$O$_3$ Thin Films by Pulsed Laser Deposition", Appl. Phys. Lett; pp. 1565–1567 Sep. 1991.
Ramesh et al. "Ferroelectric bismuth titanate/superconductor (Y–Ba–Cu–O) thin film heterostructure on silicon"; Appl. Phys. Lett. 59(4), 30 Sep. 1991; pp. 1782–1784.
"Study of Diffusion Barriers for PZT Deposited on Si for Non-Volatile Random–Access Memory Technology" Nalin R. Parikh, J. Todd Stephen, Max L. Swanson and Edward K. Myers; Material Research Society Symposium Proceedings 1990.

*Primary Examiner*—Tom Thomas
*Assistant Examiner*—Trung Dang
*Attorney, Agent, or Firm*—Brian A. Carlson; James C. Kesterson; Richard L. Donaldson

[57] ABSTRACT

This is a method for fabricating a structure useful in semiconductor circuitry. The method comprises: growing a buffer layer of non-Pb/Bi-containing high-dielectric constant oxide layer directly or indirectly on a semiconductor substrate; and depositing a Pb/Bi-containing high-dielectric constant oxide on the buffer layer. Alternately this may be a structure useful in semiconductor circuitry, comprising: a buffer layer 26 of non-lead-containing high-dielectric constant oxide layer directly or indirectly on a semiconductor substrate 10; and a lead-containing high-dielectric constant oxide 28 on the buffer layer. Preferably a germanium layer 12 is epitaxially grown on the semiconductor substrate and the buffer layer is grown on the germanium layer. When the substrate is silicon, the non-Pb/Bi-containing high-dielectric constant oxide layer is preferably less than about 10 nm thick. A second non-Pb/Bi-containing high-dielectric constant oxide layer 30 may be grown on top of the Pb/Bi-containing high-dielectric constant oxide and a conducting layer (top electrode 32) may also be grown on the second non-Pb/Bi-containing high-dielectric constant oxide layer.

36 Claims, 1 Drawing Sheet

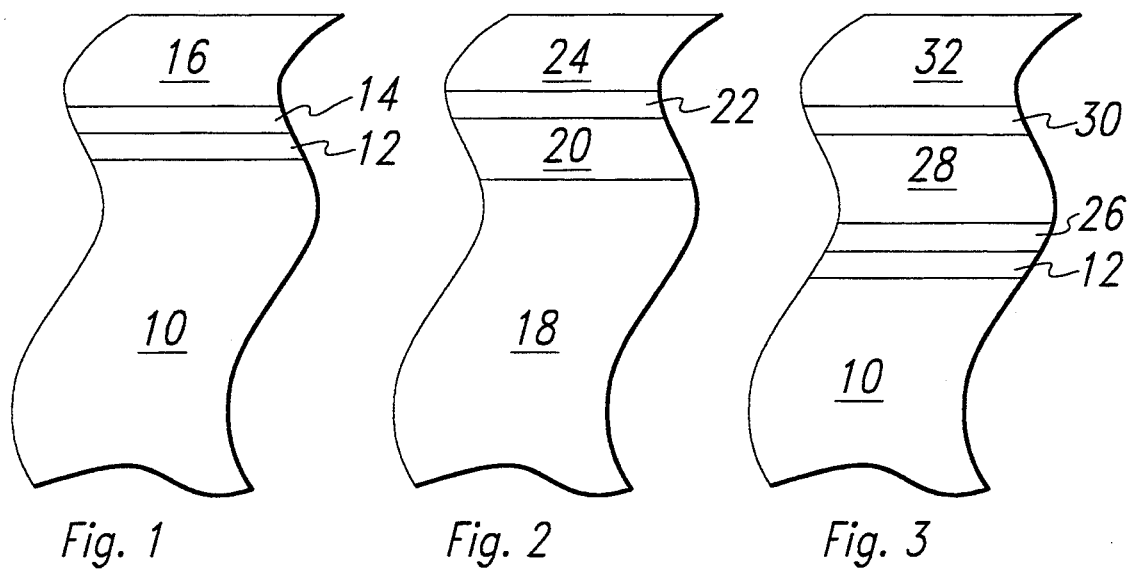

5,393,352

PB/BI-CONTAINING HIGH-DIELECTRIC CONSTANT OXIDES USING A NON-P/BI-CONTAINING PEROVSKITE AS A BUFFER LAYER

This is a continuation, of application Ser. No. 07/876,930, filed May 5, 1992, now abandoned.

BACKGROUND OF THE INVENTION

An arrangement of layers with an oxide between a conducting layers and another conductor or semiconductor is usable as a portion of many of the structures used in semiconductor circuitry, such as capacitors, MOS transistors, pixels for light detecting arrays, and electrooptic applications. High-dielectric oxide materials provide several advantages (e.g. ferroelectric properties and/or size reduction of capacitors). Pb/Bi-containing high-dielectric materials are convenient because of their relative low annealing temperatures and, as they retain desirable properties in the small grains preferred in thin films.

The integration of non-$SiO_2$ based oxides directly or indirectly on Si is difficult because of the strong reactivity of Si with oxygen. The deposition of non-$SiO_2$ oxides have generally resulted in the formation of a $SiO_2$ or silicate layer at the Si//oxide interface. This layer is genre ally amorphous and has a low dielectric constant. These properties degrade the usefulness of non-$SiO_2$ based oxides with Si. High-dielectric constant oxide (e.g. a ferroelectric oxide) can have a large dielectric constant, a large spontaneous polarization, and a large electrooptic properties. Ferroelectrics with a large dielectric constant can be used to form high density capacitors but can not deposited directly on Si because of the reaction of Si to form a low dielectric constant layer. Such capacitor dielectrics have been deposited on "inert" metals such as Pt, but even Pt or Pd must be separated from the Si with one or more conductive buffer layers.

Putting the high dielectric material on a conductive layer (which is either directly on the semiconductor or on an insulating layer which is on the semiconductor) has not solved the problem. Of the conductor or semiconductor materials previously suggested for use next to high dielectric materials in semiconductor circuitry, none of these materials provides for the epitaxial growth of high dielectrical materials on a conductor or semiconductor. Further, the prior art materials generally either form a silicide which allows the diffusion of silicon into the high dielectric materials, or react with silicon or react with the high dielectric oxide to form low dielectric constant insulators.

The large spontaneous polarization of ferroelectrics when integrated directly on a semiconductor can also be used to form a non-volatile, non-destructive readout, field effect memory. This has been successfully done with non-oxide ferroelectrics such as $(Ba,Mg)F_2$ but much less successfully done with oxide ferroelectrics because of the formation of the low dielectric constant $SiO_2$ layer acts to reduce the field within the oxide. The oxide can also either poison the Si device or create so many interface traps that the device will not operate properly.

Ferroelectrics also have interesting electrooptic applications where epitaxial films are preferred in order to reduce loss due to scattering from grain boundaries and to align the oxide in order to maximize its anisotropic properties. The epitaxial growth on Si or GaAs substrates has previously been accomplished by first growing a very stable oxide or fluoride on the Si or GaAs as a buffer layer prior to growing another type of oxide. The integration of oxides on GaAs is even harder than Si because the GaAs is unstable in $O_2$ at the normal growth temperatures 450 C.–700 C.

SUMMARY OF THE INVENTION

While Pb/Bi-containing high-dielectric materials are convenient because of their relative low annealing temperatures and their desirable properties in the small grains, Pb and Bi are very reactive and have been observed to diffuse into and through metals such as Pd or Pt.

A Ge buffer layer on Si oxidizes much less readily and can be used to prevent or minimize the formation of the low dielectric constant layer. An epitaxial Ge layer on Si provides a good buffer layer which is compatible with Si and also many oxides. Unlike other buffer layers, Ge is a semiconductor (it can also be doped to provide a reasonably highly conductive layer) and is compatible with Si process technology. The epitaxial growth of Ge on top of the ferroelectric or high-dielectric constant oxide is also much easier than Si which makes it possible to form three dimensional epitaxial structures. The Ge buffer layer can be epitaxially gown on the Si substrate allowing the high dielectric constant oxide to be epitaxially gown on the Ge and hence epitaxially aligned to the Si substrate. The epitaxial Ge layer allows ferroelectrics to be directly gown on Si wafers to form non-volatile non-destructive read out memory cells. The Ge buffer layer will also increase the capacitance of large dielectric constant oxide films compared to films gown directly on Si. A Ge buffer layer on the Si or GaAs substrate allows many more oxides to be epitaxially gown on it because of the much smaller chemical reactivity of Ge with oxygen compared to Si or GaAs with oxygen.

However, not all oxides are stable next to Ge. For example, all ferroelectrics containing Pb such as $Pb(Ti,Zr)O_3$ (PZT) are not thermodynamically stable next to Ge (since PbO is not stable). A thin layer of $SrTiO_3$ or other stable ferroelectric can, however, be used as a buffer layer between the Pb containing ferroelectric and the Ge coated Si substrate. The $SrTiO_3$ not only acts as a chemical barrier, but also nucleates the desired perovskite structure (instead of the undesirable pyrochlore structure).

As noted, the integration of oxides on GaAs is even harder than Si because the GaAs is unstable in $O_2$ at the normal growth temperatures of high-dielectric constant oxide (450 C.–700 C.). An epitaxial Ge and non-Pb/Bi-containing high-dielectric material buffer layers solves this problem and simplifies the integration of Pb/Bi-containing ferroelectrics on GaAs for the same applications as listed above.

This is a method for fabricating a structure useful in semiconductor circuitry. The method comprises: growing a buffer layer of non-Pb/Bi-containing high-dielectric constant oxide layer directly or indirectly on a semiconductor substrate; and depositing a Pb/Bi-containing high-dielectric constant oxide on the buffer layer.

Preferably a germanium layer is epitaxially gown on the semiconductor substrate and the buffer layer is grown on the germanium layer. The non-Pb/Bi-containing high-dielectric constant oxide layer is preferably less than about 10 nm thick.

A second non-Pb/Bi-containing high-dielectric constant oxide layer may be grown on top of the Pb/Bi-containing high-dielectric constant oxide and a conducting layer may also be grown on the second non-Pb/Bi-containing high-dielectric constant oxide layer.

Preferably both the high-dielectric constant oxides are ferroelectric oxides and/or titanates, the non-Pb/Bi-containing high-dielectric constant oxide is barium strontium titanate, and the Pb/Bi-containing high-dielectric constant oxide is lead zirconate titanate. Both the non-Pb/Bi-containing high-dielectric constant oxide and the Pb/Bi-containing high-dielectric constant oxide may be epitaxially grown.

Alternately this may be a structure useful in semiconductor circuitry, comprising: a buffer layer of non-Pb/Bi-containing high-dielectric constant oxide layer directly or indirectly on a semiconductor substrate; and a Pb/Bi-containing high-dielectric constant oxide on the buffer layer. When the substrate is silicon, a germanium layer, preferably less than about 1 nm thick is preferably used on the silicon. Both the non-Pb/Bi-containing high-dielectric constant oxide and the Pb/Bi-containing high-dielectric constant oxide may be single-crystal. A second non-Pb/Bi-containing high-dielectric constant oxide layer may be used on top of the Pb/Bi-containing high-dielectric constant oxide.

BRIEF DESCRIPTION OF THE DRAWINGS

Further features of the present invention will become apparent from a description of the fabrication process and structure thereof, taken in conjunction with the accompanying drawings, in which:

FIG. 1 shows a cross-section of one embodiment of a multi-layer structure using a BST buffer layer, FIG. 2 shows a cross-section of an alternate embodiment of a multi-layer structure using a BaZrO3 (BZ) buffer layer; and FIG. 3 shows a cross-section of an embodiment of a multi-layer structure using a second buffer layer and a top electrode.

DETAILED DESCRIPTION OF THE INVENTION

As noted, Pb/Bi-containing high-dielectric materials are convenient but Pb and Bi are very reactive and diffuse into and through even noble metals and growth of oxides on Si generally results in the oxidation of the Si and the formation of $SiO_2$ or a silicate layer. Further, this $SiO_2$ layer prevents the epitaxy of the deposited oxide and has a low dielectric constant and the integration of ferroelectrics and other large dielectric constant materials directly on Si is degraded by the formation of the low dielectric constant $SiO_2$ layer (on metal). Also as noted, putting the high dielectric material on a metallic layer (which is either directly on the semiconductor or on an insulating layer which is on the semiconductor) has not solved the problem with PbBi diffusion. The diffusion of lead or bismuth from ferroelectrics such as Pb(Ti,Zr)O (PZT) into an adjacent metal can, however, be controlled by a thin layer of $SrTiO_3$ or other stable high-dielectric oxide used as a buffer layer between the Pb/Bi containing ferroelectric and the metallic layer or the Si substrate.

Preferably a Ge buffer layer is used between high-dielectric oxides and Si or metal reduces the reactivity at the surface and in general enhances the epitaxy and at least reduces the reaction layer between the deposited oxide and the substrate. The epitaxial growth of Ge on Si is compatible with current Si process technology. The main difficulty with Ge on Si is the 4% lattice mismatch which results in misfit dislocation on Ge films thicker than 1 nm. On silicon, the Ge layer is preferably very thin to avoid the misfit dislocations (however a thicker layer may be used for some devices if that is not detrimental to the performance of the device in question). In still other embodiments, polycrystalline Ge may be formed over polycrystalline Si (thus using the Ge as a chemical buffer layer between a deposited oxide and the Si substrate). Depending on the application the choice of materials may be very different. For large density capacitors, currently the best linear dielectric appears to be $(Ba_{1-x},Sr_x)TiO_3$ (BST). $BaTiO_3$ (BT) or $SrTiO_3$ (ST) when deposited directly on Si forms a low dielectric constant layer, and thus BT and ST are not thermodynamically stable next to Si. Ge, however, has a much smaller free energy of oxidation and BT and ST are thermodynamically stable next to Ge. It is also possible to deposit BT and ST in a $H_2+O_2$ gas mixture such that Ge is stable and also BT or ST is stable while $GeO_2$ is not stable.

As noted above, not all oxides are stable next to Ge. For example, all ferroelectrics containing Pb such as Pb(Ti,Zr)O (PZT) are much less stable next to Ge (since PbO is not stable). A thin layer of $SrTiO_3$ or other stable ferroelectric can, however, be used as a buffer layer between the Pb containing ferroelectric and the Ge coated Si substrate. The $SrTiO_3$ not only acts as a chemical barrier, but also nucleates the desired perovskite structure (instead of the undesirable pyrochlore structure).

There has been little investigation of the use of a second ferroelectric layer as a chemical buffer layer. Others have deposited a thin layer of $PbTiO_3$, or (Pb,La)$TiO_3$ prior to the deposition of PZT in order to help nucleate the perovskite structure and avoid the formation of pyrochlore, but apparently have not used the depositing of a stable ferroelectric buffer layer to act as a diffusion barrier.

$SrTiO_3$ (ST0) or $BaTiO_3$ (BT), for example, can be used as a buffer layer between Pt and PZT. The ST or BT improve the properties for several reasons. The first is that Pb is very reactive and it has been observed to diffuse into and through Pt. ST or BT is much less reactive and forms a good diffusion barrier to Pb. Because ST has the same perovskite structure, the Pb will slowly react with the ST and form (Pb,Sr)$TiO_3$. This reaction is believed to be by bulk diffusion which is fairly slow. The ST will also act as a nucleation layer for the perovskite structure of PZT. ST also has a very low leakage current and a thin layer tends to improve the leakage properties of the PZT. Such a buffer layer needs to be structurally compatible with the ferroelectric (perovskite structure for PZT), and chemically compatible with both layers. Materials like $BaZrO_3$ (BZ) satisfy these requirements for PZT. In addition, the buffer layer must not significantly degrade the electrical properties. ST, BST, and BT have large dielectric constants which helps share the electric field and hence are preferred to materials with a somewhat lower dielectric constant (like BZ). What matters is the properties after the deposition of the second (lead-containing) ferroelectric layer. This deposition can change the properties of the buffer layer.

It is also important to avoid problems between the non-lead-containing high-dielectric material and the substrate. An epitaxial Ge buffer layer was used in experiments on a (100) Si substrate to deposit epitaxial BST. Without the Ge buffer layer, the BST was randomly oriented polycrystalline. With the Ge buffer layer, most of the BST has the following orientation relationship (110) BST || (100) Si. This showed that the Ge buffer layer has prevented the formation of a low dielectric layer at the interface prior to epitaxy since that layer would prevent epitaxy.

The deposition of a ferroelectric directly on a semiconductor has been used by others to create a non-volatile nondestructive readout memory. This device is basically a MOS transistor where the $SiO_2$ has been replaced with a ferroelectric (metal-ferroelectric-semiconductor or MFS). One memory cell consists of a MFS transistor and a standard MOS transistor. This type of memory has many advantages including very fast read/write as well having nearly the same density as a standard DRAM cell. The remnant polarization in the ferroelectric can be used induce a field into the semiconductor and hence the device is non-volatile and non-destructive. This device has been successfully made by others using a $(Ba,Mg)F_2$ ferroelectric layer epitaxially grown by MBE on the Si substrate. Oxide perovskites such as PZT have also been studied for non-volatile memories but these materials can not be deposited directly on Si without reacting with the Si. A Ge buffer layer will allow many stable ferroelectrics, such as $BaTiO_3$, to be used in a RAM. A second buffer layer of $SrTiO_3$ or some other stable ferroelectric should allow even most chemically reactive ferroelectric oxides to be used to try to form a RAM. The Ge buffer layer would also allow this type of memory to be fabricated on GaAs and other III–V compounds in addition to Si. It also might be possible to fabricate a thin-film MFS transistor by depositing the Ge on top of the ferroelectric. The ferroelectric might be epitaxial on the GaAs or Si substrate or it might be polycrystalline. The compatibility of Ge with a stable ferroelectric buffer layer allows this structure to be manufactured, including with a lead-containing high-dielectric material.

In FIG. 1 there is shown one preferred embodiment (in all figures, an arrangement of layers is shown which is usable as a portion of many structures used in semiconductor circuitry, such as capacitors, MOS transistors, pixels for light detecting arrays, and electrooptic applications. FIG. 1 shows a semiconductor substrate 10, on which a doped polycrystalline germanium layer 12 has been deposited (the germanium can be highly doped to provide a highly conductive layer). The germanium can be polycrystalline or single-crystal. A ferroelectric barium strontium titanate layer 14 (which also can be polycrystalline or single-crystal) is deposited on the germanium layer, and a lead zirconium titanate layer 16 is deposited atop the barium strontium titanate 14. As noted, such an arrangement of layers is usable in many semiconductor structures and the ferroelectric or high dielectric properties of a non-lead-containing buffer layer such as barium strontium titanate provides advantageous properties over most other insulating materials.

While optimum properties of non-lead-containing high dielectric materials are not generally obtained without a relatively high temperature anneal and are not generally obtained in submicron sized gains, the fine gained material without a high temperature anneal, still has material properties substantially superior to alternate materials. Thus while barium strontium titanate with a high temperature anneal and with gain size of 2 microns or more, generally has a dielectric constant of greater than 10,000, a fine gained low temperature annealed barium strontium titanate might have a dielectric constant of 200–500. Thus, when used as a buffer layer for lead zirconium titanate (with a similar gain size and firing temperature, might have a dielectric constant of 800–1,000), such that the composite film dielectric constant lowered only slightly from the dielectric constant of the lead zirconium titanate. Thus, a composite dielectric is provided which provides good dielectric constants with fine grained and relatively low fired material.

FIG. 2 shows an alternate embodiment, utilizing a gallium arsenide substrate 18 with a platinum-titanium-gold layer 20 and a $BaZrO_3$ buffer layer 22 (again note that such a barium zirconate layer provides a somewhat lower dielectric constant, but this is less of a problem in very thin layers). In FIG. 2, the top layer is (Pb,La)$TiO_3$.

While, top electrodes can be applied directly over the lead-containing high dielectric material, (as lead migration into the top electrode does not cause the very serious problems caused by lead diffusing into a semiconductor substrate), a top buffer layer is preferred between the lead containing high dielectric material and the top electrode. FIG. 3 illustrates such an arrangement. A germanium layer 12 is utilized on top of the silicon substrate 10, with a $SrHfTiO_3$ layer 26 on top of the germanium layer 12. A $Bi_4Ti_3O_{12}$ layer 28 is on the $SrHfTiO_3$ layer 26 and a top buffer layer of $BaSrTiO_3$ 30 is on top of the $Bi_4Ti_3O_{12}$ 28. A titanium tungsten top electrode 32 is then deposited atop the second buffer layer 26. To provide a structure which is even more stable, a second germanium layer (not shown) could be inserted between the $BaSrTiO_3$ 30 and the titanium tungsten top electrode 32.

The use of a second germanium layer allows the usage of a wider variety of conductors for the top electrode and allows higher temperature processing during and after the deposition of the top electrode, as the germanium generally prevents reaction between the top electrode material and the ferroelectric material.

While a number of materials have been previously been suggested for use next to high dielectric materials (such as barium strontium titanate or lead zirconium titanate), none of these materials provides for the epitaxial growth of high dielectrical materials on a conductor or semiconductor. Further, the prior art materials generally either form a silicide (e.g. of palladium, platinum or titanium) which allows the diffusion of silicon into the high dielectric materials, or react with silicon (e.g. tin dioxide) or react with the high dielectric oxide to form low dielectric constant insulators (e.g. titanium monoxide or tantalum pentoxide). Thus the prior art conductive materials suggested for interfacing with high dielectric constant oxides with semiconductors either have reacted with the high dielectric constant oxides or with the semiconductor and/or metal have not provided a diffusion barrier between the high dielectric constant oxides and semiconductor material. At the annealing temperatures necessary to produce good quality high dielectric constant oxide material, such reactions generally form low dielectric constant insulators, which being in series with the high dielectric constant oxide material, dramatically lowers the effective dielectric constant. Only germanium (doped or undoped) gives a conductor or semiconductor which reacts neither with the semiconductor substrate nor the high dielectric constant oxide at the required annealing temperatures, and only germanium provides for epitaxial growth of a conductive or semiconductive material on a semiconductor substrate, in a matter compatible with growing and annealing of a high dielectric constant oxide in a non-reactive manner, such that a metal oxide metal or metal oxide semiconductor structure can be fabricated without the effective dielectric constant being significantly lowered by a low dielectric constant material between the high dielectric constant material and the underlying conductor or semiconductor. Even using germanium, however, does not completely eliminate problems with the Pb/Bi diffusion, and thus a non-Pb/Bi high-dielectric oxide containing buffer layer is still needed.

Since various modifications of the semiconductor (e.g. silicon or gallium arsenide) structure, and the methods of fabrication thereof, are undoubtedly possible by those skilled in the art without departing from the scope of the invention, the detailed description is thus to be considered illustrative and not restrictive of the invention as claimed hereinbelow. For example, much of the discussion has generally used the term "ferroelectric" materials, however, the invention is generally applicable to any "high-dielectric constant oxide" and, while many are ferroelectric titanates, some such materials are not ferroelectric and some not titanates. The term "high-dielectric constant oxides" as used herein is to mean oxides with dielectric constants of greater than 100, and preferably greater than 1,000 (barium strontium titanate can have dielectric constants greater than 10,000). Many such non-Pb/Bi oxides can be considered to be based on $BaTiO_3$ and includes oxides of the general formula $(Ba,Sr,Ca)(Ti,Zr,Hf)O_3$. Many other oxides of the general formula $(K,Na,Li)(Ta,Nb)O_3$ will also work. Pb/Bi oxides, for the purpose of this invention, generally include perovskites whose component oxides are thermodynamically unstable next to germanium metal and non-Pb/Bi high-dielectric oxides for these purposes generally include perovskites whose component oxides are thermodynamically stable next to germanium metal (even if a germanium layer is not used). Pb/Bi oxides include materials such as $(Pb,La)ZrTiO_3$ or $(Pb,Mg)NbO_3$ or $Bi_4Ti_3O_{12}$. All these oxides can also be doped with acceptors such as Al, Mg, Mn, or Na, or donors such as La, Nb, or P. Other semiconductors can also be used in addition to silicon and gallium arsenide.

What is claimed is:

1. A method for fabricating a structure useful in semiconductor circuitry comprising:
    growing a germanium layer directly or indirectly on a semiconductor substrate;
    growing a perovskite buffer layer of Pb and Bi free, high-dielectric constant oxide on said germanium layer; and
    depositing a Pb and/or Bi-containing high-dielectric constant oxide on said buffer layer.

2. The method of claim 1, wherein said substrate is silicon.

3. The method of claim 1, wherein said Pb and Bi free, high-dielectric constant oxide layer is less than about 10 nm thick.

4. The method of claim 1, wherein said substrate is gallium arsenide.

5. The method of claim 1, wherein a second Pb and Bi free, high-dielectric constant oxide layer is grown on top of said Pb and/or Bi-containing high-dielectric constant oxide.

6. The method of claim 5, wherein a conducting layer is grown on said second Pb and Bi free, high-dielectric constant oxide layer.

7. The method of claim 1, wherein both said high-dielectric constant oxides are titanates.

8. The method of claim 7, wherein said Pb and Bi free, high-dielectric constant oxide is barium strontium titanate.

9. The method of claim 1, wherein said Pb and/or Bi-containing high-dielectric constant oxide is lead zirconate titanate.

10. The method of claim 1, wherein both said high-dielectric constant oxides are ferroelectric oxides.

11. The method of claim 1, wherein said Pb and Bi free, high-dielectric constant oxide is epitaxially grown.

12. The method of claim 11, wherein said Pb and/or Bi-containing high-dielectric constant oxide is epitaxially grown.

13. The method of claim 1, wherein said germanium layer is grown on a non-single crystal silicon dioxide, a silicon nitride, or silicon dioxide/silicon nitride layer and said non-single crystal layer is directly or indirectly on said semiconductor substrate.

14. The method of claim 1, wherein said structure is a capacitor.

15. The method of claim 1, wherein said structure is a MOS transistor.

16. The method of claim 10, wherein said structure is a MOS transistor.

17. The method of claim 1, wherein said structure is a pixel in a light detecting array.

18. The method of claim 1, wherein said structure is a non-volatile, non-destructive readout, field effect memory.

19. The method of claim 1, wherein said germanium layer is epitaxially grown.

20. A method for fabricating a structure useful in semiconductor circuitry, comprising:
    depositing a metal layer directly or indirectly on a semiconductor substrate;
    growing a perovskite buffer layer of Pb and Bi free, high-dielectric constant oxide on said metal layer; and
    depositing a Pb and/or Bi-containing high-dielectric constant oxide on said buffer layer.

21. The method of claim 20, wherein said substrate is silicon.

22. The method of claim 20, wherein said Pb and Bi free, high-dielectric constant oxide layer is less than about 10 nm thick.

23. The method of claim 20, wherein said substrate is gallium arsenide.

24. The method of claim 20, wherein a second Pb and Bi free, high-dielectric constant oxide layer is grown on top of said Pb and/or Bi-containing high-dielectric constant oxide.

25. The method of claim 24, wherein a conducting layer is grown on said second Pb and Bi free, high-dielectric constant oxide layer.

26. The method of claim 20, wherein both said high-dielectric constant oxides are titanates.

27. The method of claim 26, wherein said Pb and Bi free, high-dielectric constant oxide is barium strontium titanate.

28. The method of claim 20, wherein said Pb and/or Bi-containing high-dielectric constant oxide is lead zirconate titanate.

29. The method of claim 20, wherein both said high-dielectric constant oxides are ferroelectric oxides.

30. The method of claim 20, wherein said Pb and Bi free, high-dielectric constant oxide is epitaxially grown.

31. The method of claim 30 wherein said Pb and/or Bi-containing high-dielectric constant oxide is epitaxially grown.

32. The method of claim 20, wherein said structure is a capacitor.

33. The method of claim 20, wherein said structure is a MOS transistor.

34. The method of claim 29, wherein said structure is a MOS transistor.

35. The method of claim 20, wherein said structure is a pixel in a light detecting array.

36. The method of claim 20, wherein said structure is a non-volatile, non-destructive readout, field effect memory.

* * * * *